United States Patent [19]

Tanaka

[11] Patent Number: 5,761,038

[45] Date of Patent: Jun. 2, 1998

[54] ELECTRICAL CONNECTION BOX

[75] Inventor: Mitsuo Tanaka, Hikone, Japan

[73] Assignee: The Furukawa Electric Co.,Ltd., Tokyo, Japan

[21] Appl. No.: 655,706

[22] Filed: May 30, 1996

[51] Int. Cl.$^6$ .................. H05K 7/20; H02B 1/26
[52] U.S. Cl. .................. 361/700; 174/15.2; 361/641
[58] Field of Search ................ 165/80.4, 104.33; 174/15.2; 361/622, 626, 641, 698, 699, 700, 831

[56] References Cited

U.S. PATENT DOCUMENTS 4,449,576 5/1984 Baum et al. .
5,075,822 12/1991 Baumler et al. .

FOREIGN PATENT DOCUMENTS 0 151 546  8/1985  European Pat. Off. .
3-97318   10/1991  Japan .
2 227 123  7/1990  United Kingdom .

*Primary Examiner*—Gregory D. Thompson
*Attorney, Agent, or Firm*—Frishauf, Holtz, Goodman, Langer & Chick

[57] ABSTRACT

An electrical connection box having heat generating electrical parts contained therein includes an upper case, a case body, and a lower case. The case body has a top surface on which numerous concave grooves are formed in a matrix shape, and at least one of the concave grooves receives a cooling device therein in such a manner that a heat absorbing side of the cooling device is positioned inside the electrical connection box and a heat radiating side of the cooling device is located outside of the electrical connection box. Alternatively, the case body may include numerous attaching holes formed in a thickness direction of the case body or in a direction perpendicular to the thickness direction of the case body, and at least one of the attaching holes receives a cooling device therein in such a manner that a heat absorbing side of the cooling device is positioned inside the electrical connection box and a heat radiating side of the cooling device is located outside of the electrical connection box. A position of the cooling device is capable of being changed in accordance with given mounting positions of the heat generating electrical parts.

6 Claims, 7 Drawing Sheets

ELECTRICAL CONNECTION BOX

BACKGROUND OF THE INVENTION

1. Field of the Invention

The present invention relates to an electrical connection box.

2. Background of the Invention

As shown in FIG. 14, a prior art electrical connection box, for example, an automotive electrical connection box houses electrical parts such as fuses 31 and relays 32 in a case body 30, and electrical wires 51 for input/output are connected to these electrical parts directly or via a bus bar (not shown) to form a predetermined circuit. To the case body 30 are mounted an upper case 40 for preventing water and dust on the upper side on which parts are mounted and a lower case 50 on the lower side on which the electrical wires 51 are pulled out. The lower case 50 is provided with an opening 52 through which the electrical wires are pulled out.

In the electrical connection box of the above construction, in recent years, heat generating electrical parts such as fuses and relays have been arranged densely as the number of pieces of electrical equipment mounted on an automobile has increased. As a result, for the electrical connection box of this type, the spring property of a connecting terminal for connecting the fuse or the like and the electrical wire 51 may be gradually impaired by heat generated by the electrical parts during their operation, and poor contact may occur between the fuse or the like and the electrical wire 51.

SUMMARY OF THE INVENTION

An object of the present invention is to provide an electrical connection box which can effectively achieve the characteristics of electrical parts by releasing the heat produced by a heat generating electrical part and cooling it, and in which the position of cooling means can easily be changed to a proper position suitable for cooling the heat generating electrical part.

To achieve the above object, in the present invention, the electrical connection box is assembled with heat generating electrical parts arranged in a case and is provided with many attaching portions for attaching cooling device with the heat absorbing side being positioned inside the case and a heat radiating side being positioned outside the case.

The electrical connection box in accordance with the present invention is manufactured by a molding method such as injection molding by using a material such as nylon, polybutylene terephthalate, polypropylene terephthalate, polypropylene, and ABS resin.

In the electrical connection box in accordance with the present invention, the number, shape, orientation, length, etc. of the attaching portions for attaching the cooling device are determined in accordance with given applications.

For the electrical connection box in accordance with the present invention, even if the heat generating electrical part produces heat in use, the cooling device cools the heat generating electrical part by releasing the heat to the outside, so that the characteristics of the electrical part can be achieved effectively. Also, the electrical connection box in accordance with the present invention achieves an effect that even if the arrangement of heat generating electrical parts arranged in the electrical connection box or the position where the electrical connection box is mounted on an automobile is changed, the heat generating electrical parts can be cooled in response to the above change by merely selecting suitable attaching portions from the many attaching portions and installing the cooling device at the selected attaching portions.

Preferably, the electrical connection box has an upper case, a case body, and a lower case.

Preferably, the attaching portions are concave grooves formed into a matrix shape on the top surface of the case body.

Preferably, the attaching portions are attaching holes formed in the case body in the thickness direction.

Preferably, the attaching portions are attaching holes formed in the case body in the direction perpendicular to the thickness direction.

Preferably, the cooling device is a heat pipe.

The above and other objects, features and advantages of the present invention will become more apparent in the following description based on the accompanying drawings.

DETAILED DESCRIPTION OF THE PREFERRED EMBODIMENTS

An electrical connection box in accordance with the present invention will be described in detail with reference to FIGS. 1 to 13.

Figure 1:
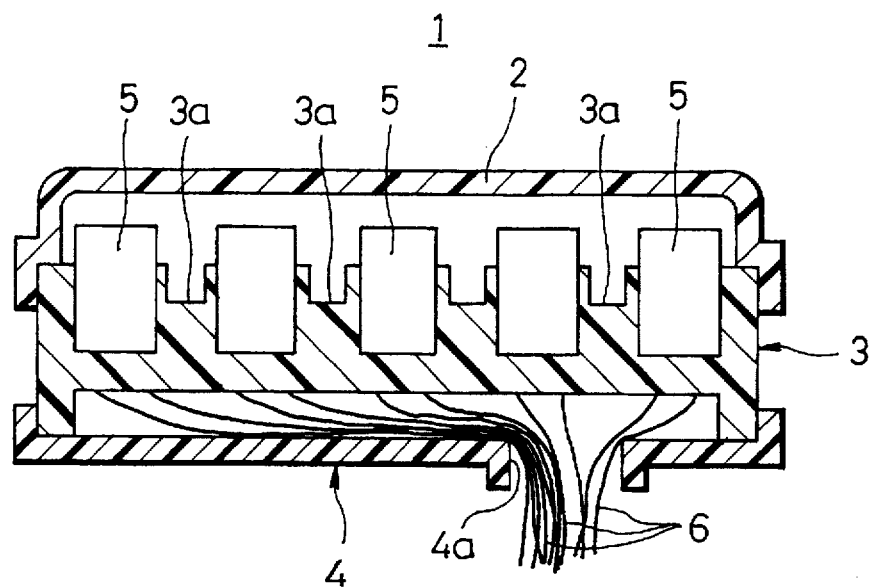
FIG. 1 is a front sectional view of an electrical connection box in accordance with the present invention.

As shown in FIG. 1, an electrical connection box 1 in accordance with the present invention has an upper case 2 for preventing water and dust, a case body 3, and a lower case 4. The box is assembled by fitting the upper case to the case body 3 in the downward direction and fitting the lower case 4 in the upward direction. The lower case 4 is provided with a pull-out opening 4a, through which electrical wires 6 connected to many electrical parts 5, described later, are pulled out of the case.

Figure 2:
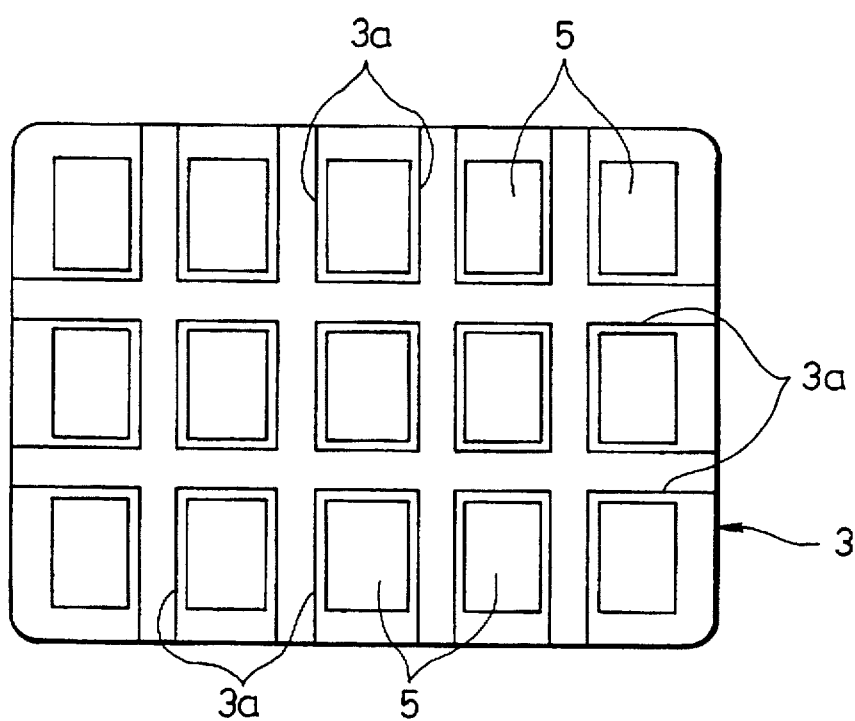
FIG. 2 is a plan view of a case body used for the electrical connection box shown in FIG. 1.
Figure 3:
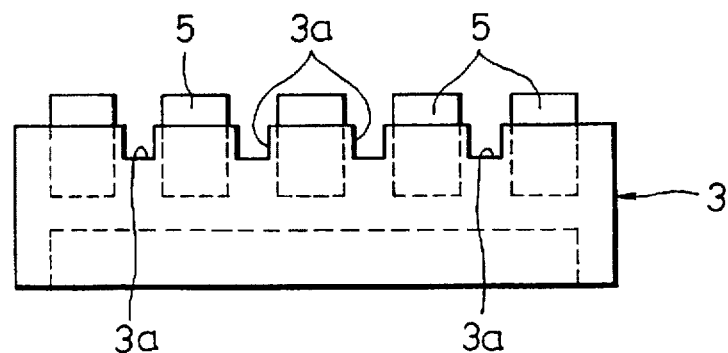
FIG. 3 is a front view of the case body shown in FIG. 2.

As shown in FIGS. 2 and 3, in the case body 3, many concave grooves 3a are formed into a matrix shape on the top surface of the case body 3, and many electrical parts 5 are arranged at the portions defined by these concave grooves 3a. To form a predetermined circuit, an electrical wire (not shown) for input/output, having a terminal attached to its one end, is connected to the electrical part 5 directly or via bus bar (not shown) by means of the terminal. The concave groove 3a is used as an attaching portion for attaching a cooling device for the electrical part when a particular electrical part 5 of many electrical parts 5 is a heat generating electrical part such as a fuse or relay.

Figure 4:
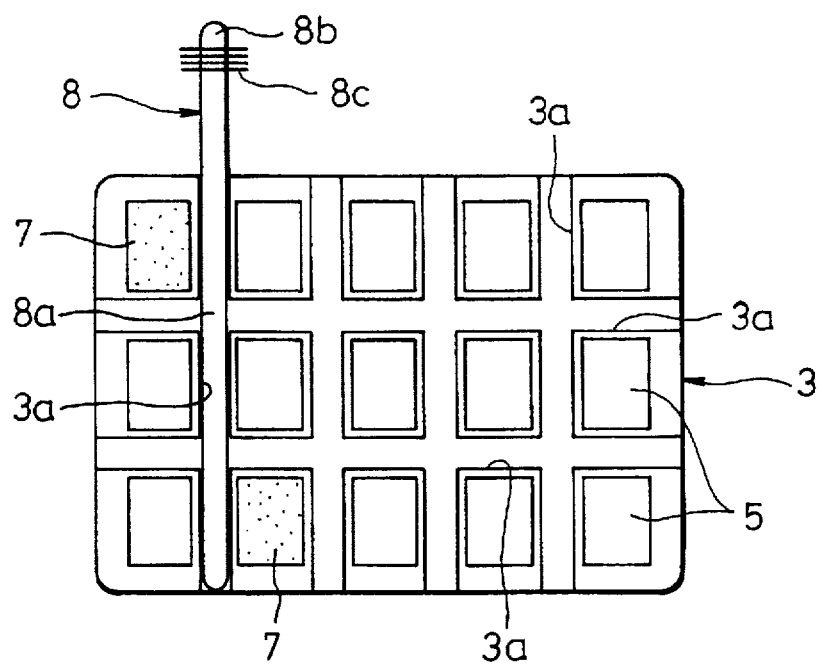
FIG. 4 is a plan view of the case body shown in FIG. 2, in which a heat pipe is arranged.
Figure 5:
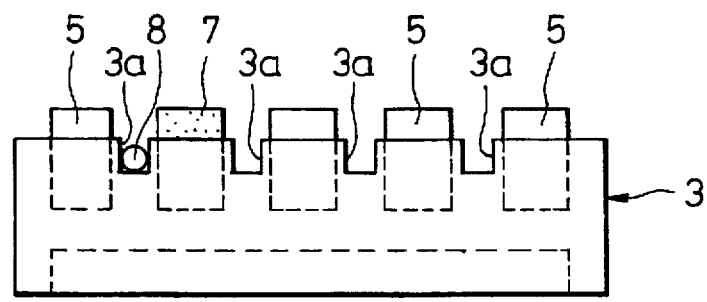
FIG. 5 is a front view of the case body shown in FIG. 4.

When two heat generating electrical parts 7 are arranged in the case body 3 as shown in FIGS. 4 and 5, therefore, a cooling device, for example, a heat pipe 8 is installed in the concave groove 3a at a position between the two heat generating electrical parts 7. The heat pipe 8 is installed in the concave groove 3a so that the heat absorbing side 8a is positioned in the concave groove 3a, and the heat radiating side 8b is positioned outside the case body 3. Therefore, the electrical connection box 1 is provided with a lead-through portion of the heat pipe 8 in the upper case 2 or the case body 3.

The heat pipe 8 is constructed by enclosing a working fluid in a sealed tubular body. In the heat pipe 8, the working fluid is evaporated on the heat absorbing side 8a by heat generated by the heat generating electrical part 7, and moves to the lower-temperature heat radiating side 8b outside the case body 3. The evaporated working fluid is liquefied by the radiation on the heat radiating side 8b, and the working fluid returns again to the heat absorbing side 8a. By this cycle, the heat pipe 8 releases heat generated by the heat generating electrical part 7 to the outside of the electrical connection box 1 to cool the heat generating electrical part 7. The heat pipe 8 is provided with fins 8c to accelerate the radiation on the heat radiating side 8b.

Figure 6:
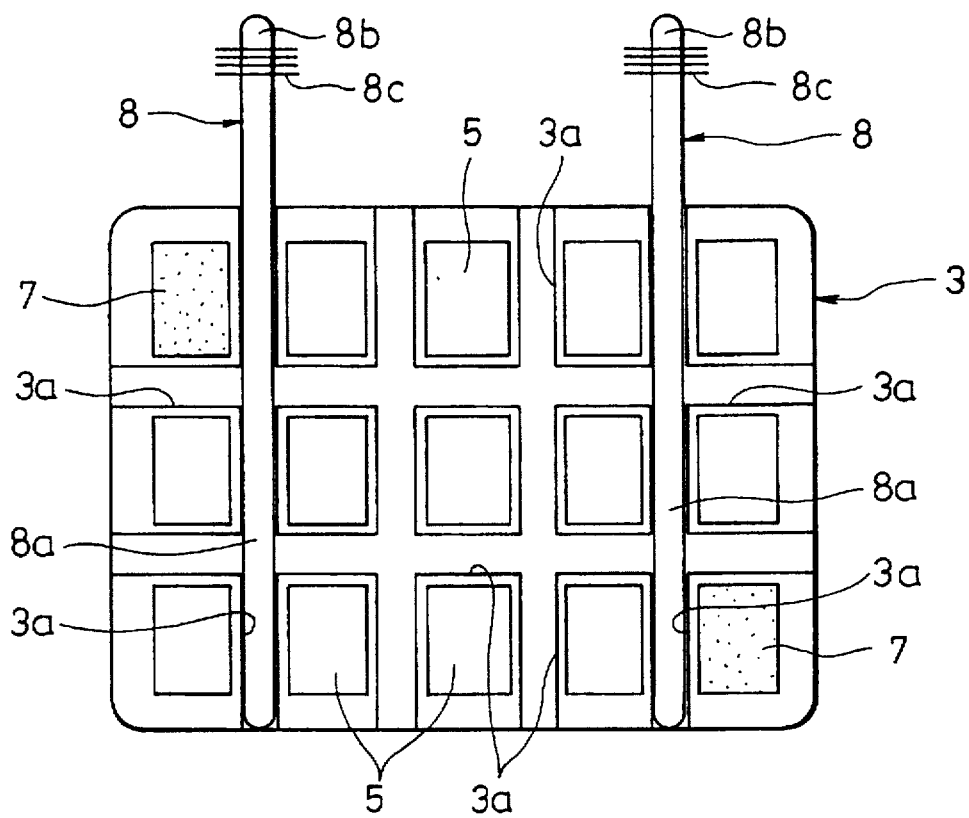
FIG. 6 is a plan view of a typical arrangement of heat pipes in a case where the arrangement of heat generating electrical parts is changed in the case body shown in FIG. 4.
Figure 7:
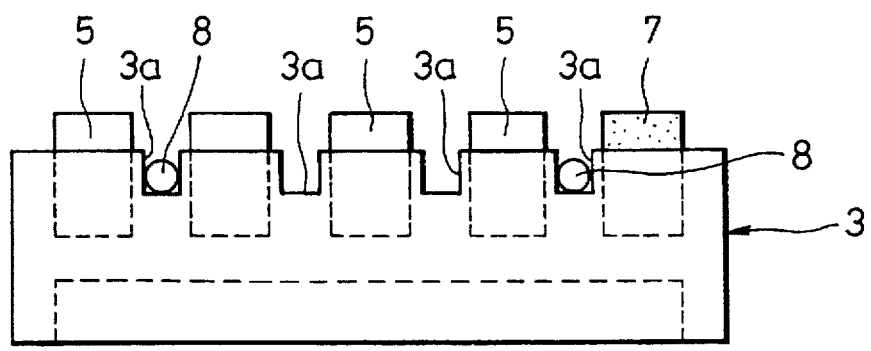
FIG. 7 is a front view of the case body shown in FIG. 6.

When the position of one of the two heat generating electrical parts 7 shown in FIGS. 4 and 5 is changed, two heat pipes 8 are installed in two concave grooves 3a as shown in FIGS. 6 and 7. For the electrical connection box 1, therefore, even if the arrangement of heat generating electrical parts 7 or the position where the electrical connection box is mounted on an automobile is changed, the heat generating electrical parts 7 can be cooled in response to the above change by merely selecting suitable concave grooves 3a from many concave grooves 3a and installing the heat pipes 8 in the selected concave grooves 3a.

In the above embodiment, a heat pipe 8 is used as means for cooling the heat generating electrical part 7 in consideration of low cost and ease of handling. In the present invention, however, the means for cooling the heat generating electrical part 7 is, needless to say, not limited to the heat pipe.

Next, modifications of attaching portion formed in the case body will be described below with reference to FIGS. 8 to 13.

Figure 8:
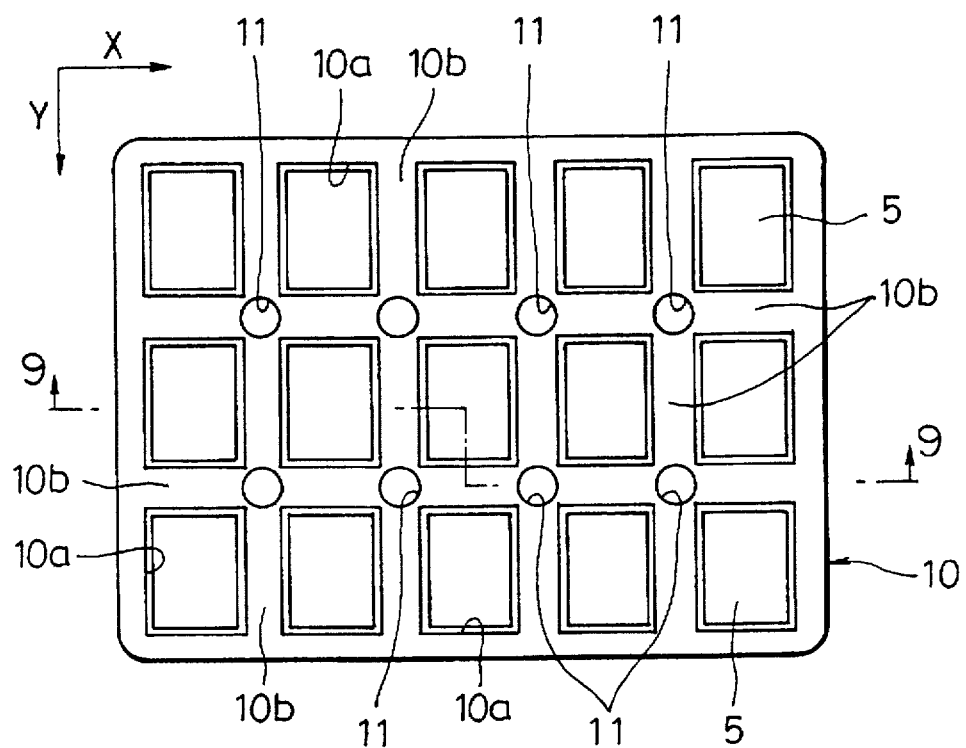
FIG. 8 is a plan view of a case body, showing a modification of attaching portions formed in the case body.
Figure 9:
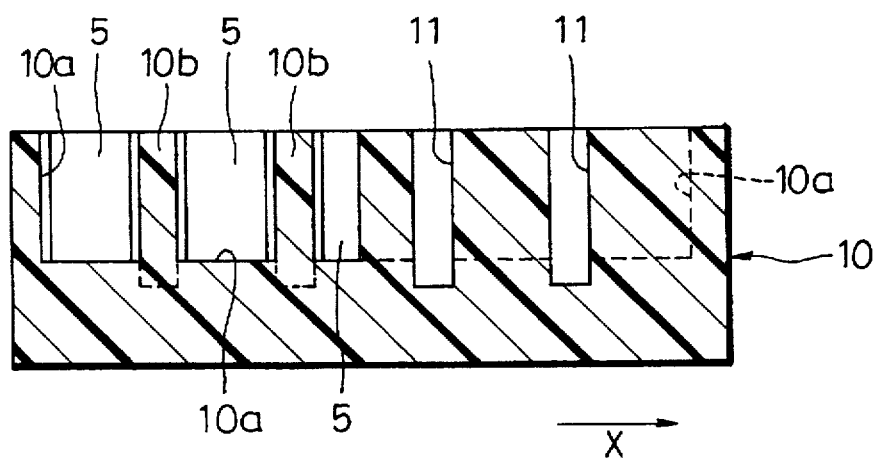
FIG. 9 is a sectional view taken along the line 9—9 of the case body shown in FIG. 8.

First, as shown in FIGS. 8 and 9, the case body 10 is formed, by means of partition walls 10b, with many concave portions 10a for arranging the electrical parts 5 at predetermined intervals in X and Y directions indicated by arrows. At crossing portions of many partition walls 10b arranged in X and Y directions, many attaching holes 11 are provided in the thickness direction.

Figure 10:
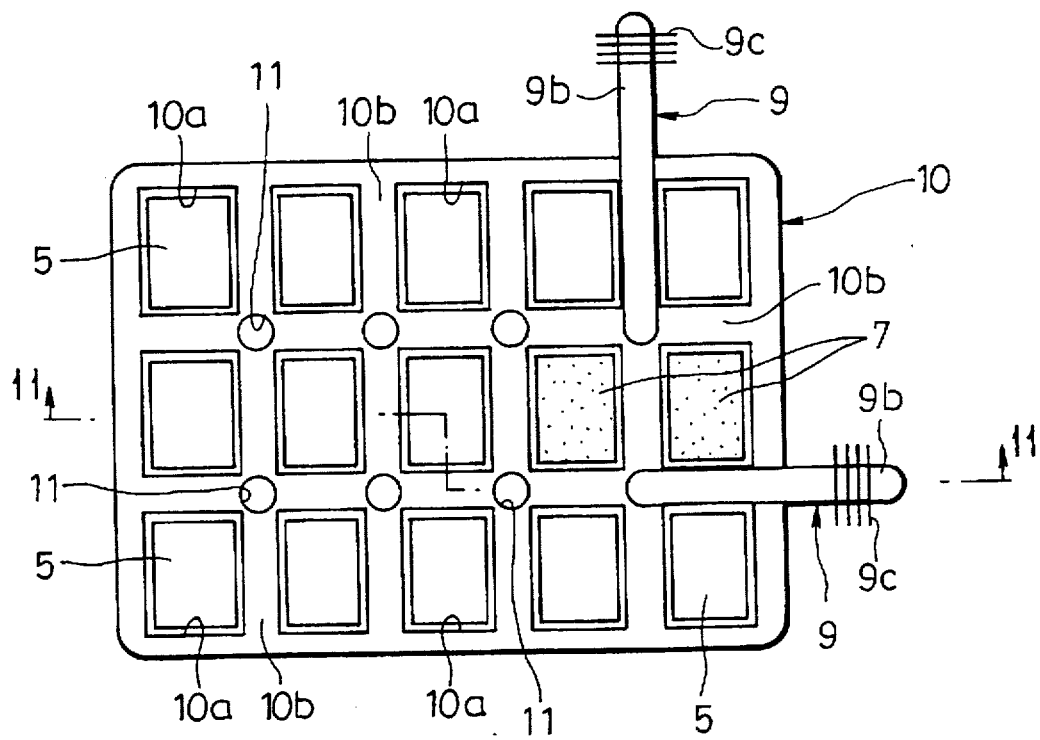
FIG. 10 is a plan view of the case body, showing another modification of attaching portions formed in the case body.
Figure 11:
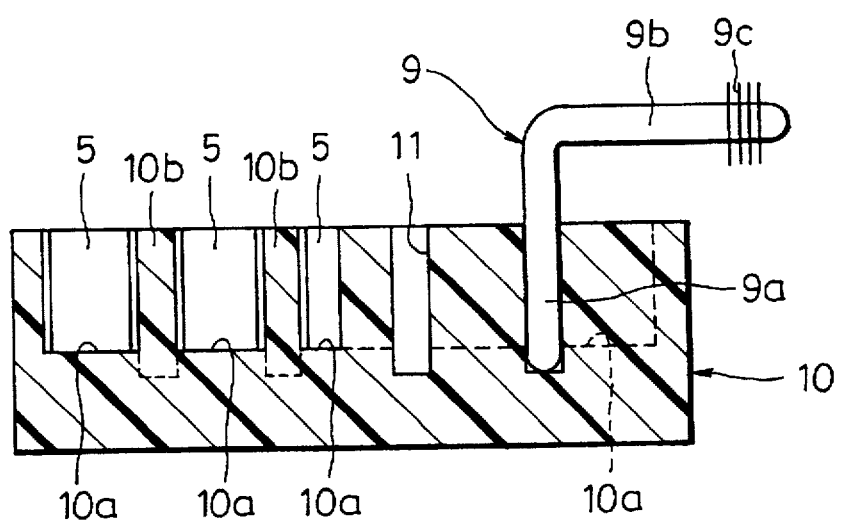
FIG. 11 is a sectional view taken along the line 11—11 of the case body shown in FIG. 10.

Therefore, when two heat generating electrical parts 7 are arranged in the case body 10 as shown in FIGS. 10 and 11, the heat pipes 9 are installed in the attaching holes 11 close to the heat generating electrical parts 7. As shown in the figures, the heat pipe 9 is formed into an L shape by bending the heat absorbing side 9a, and is installed in the case body 10 with the tip end of the heat absorbing side 9a being inserted into the attaching hole 11 and with the heat radiating side 9b being positioned outside the case body 10. Reference numeral 9c denotes fins for radiation.

For the electrical connection box using the case body 10, therefore, even if the arrangement of heat generating electrical parts 7 or the position where the electrical connection box is mounted on an automobile is changed, the heat generating electrical parts 7 can be cooled in response to the above change by merely selecting suitable attaching holes 11 from among the many attaching holes 11 and installing the heat pipes 8 in the selected attaching holes 11.

Figure 12:
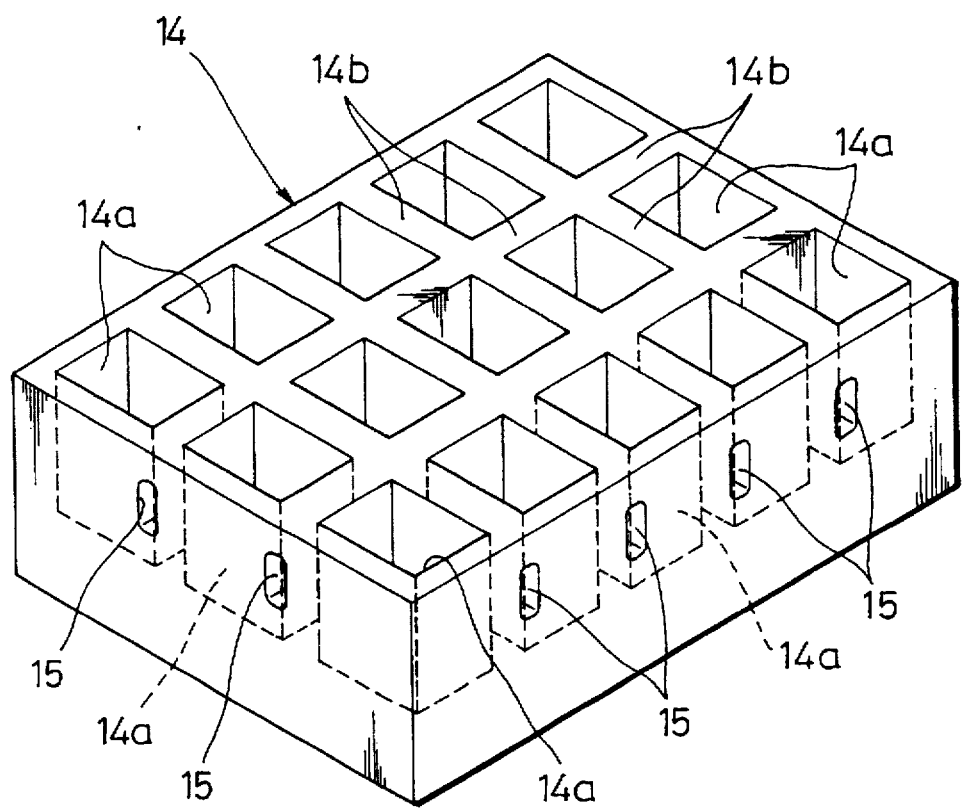
FIG. 12 is a perspective view of a case body, showing still another modification of attaching portions formed in the case body.

Also, as with the case body 14 shown in FIG. 12, many concave portions 14a for arranging the electrical parts are formed by means of the partition walls 14b, and many attaching holes may be formed in the partition walls 14b in the horizontal direction perpendicular to the thickness direction. In this case, the position in the thickness direction of the case body 14 at which the attaching hole 15 is formed is determined so that the heat absorbing side of the heat pipe is located at the middle position of the heat generating electrical part arranged in the concave portion 14a.

For the electrical connection box using the case body 14, therefore, like the electrical connection box using the case body 10, the heat generated from the heat generating electrical part can be absorbed efficiently by merely selecting a suitable attaching hole 15 from many attaching holes 15 and installing the heat pipe in the selected attaching hole 15.

Figure 13:
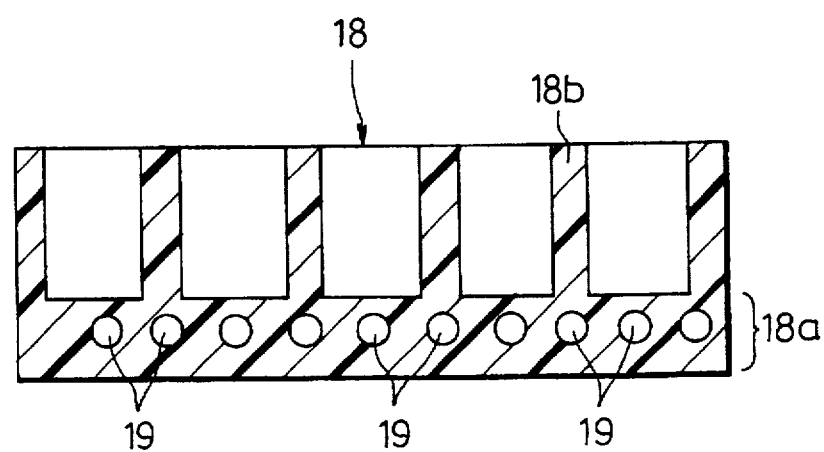
FIG. 13 is a front sectional view of a case body, showing a further modification of attaching portions formed in the case body.
Figure 14:
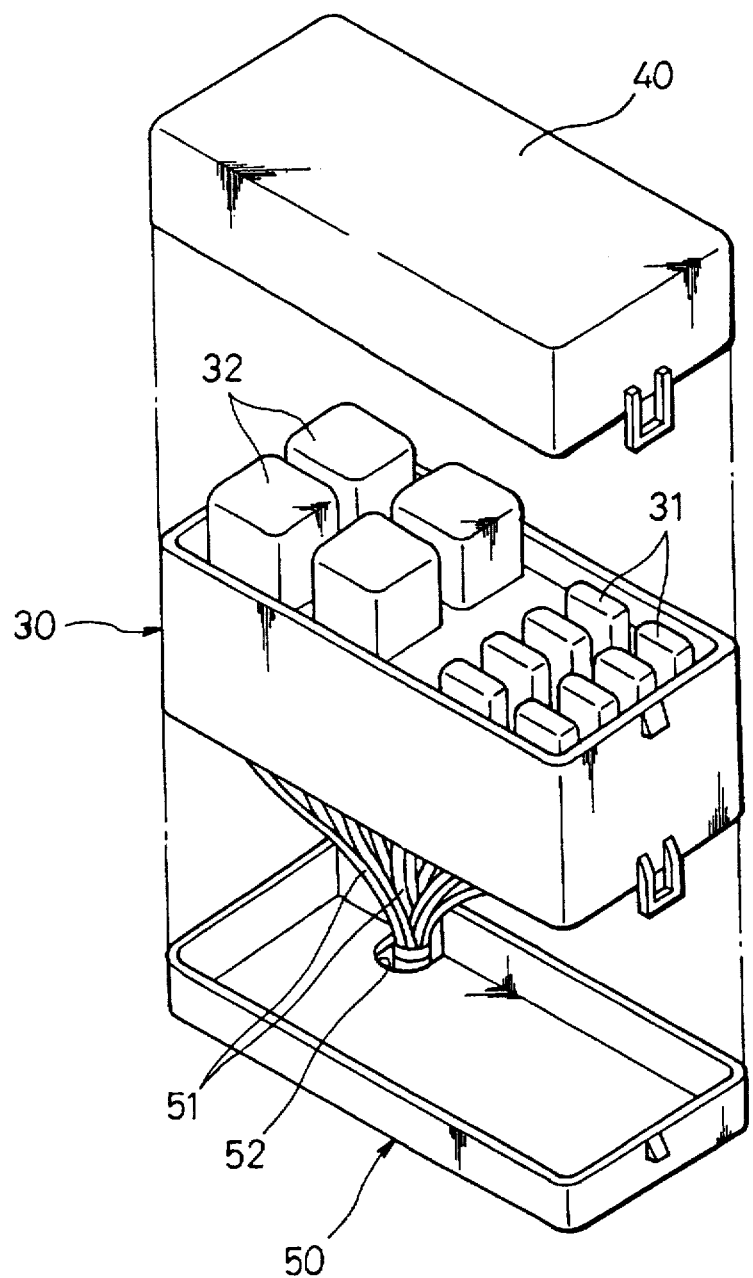
FIG. 14 is an exploded perspective view of a prior art electrical connection box.

Further, as with the case body 18 shown in FIG. 13, many attaching holes 19, which are arranged at right angles to each other and in which the heat pipes are installed, may be formed in a base 18a in the horizontal direction. Finally, the case body 18 is used supplementarily when a space sufficient to install a heat pipe cannot be taken in the partition wall 18b.

What is claimed is:

1. An electrical connection box having heat generating electrical parts contained therein, said electrical connection box including an upper case, a case body, and a lower case, wherein:

said case body has a top surface on which numerous concave grooves are formed in a matrix shape;

at least one of said concave grooves receives a cooling device therein in such a manner that a heat absorbing side of the cooling device is positioned inside the electrical connection box and a heat radiating side of the cooling device is located outside of the electrical connection box; and a position of said cooling device is capable of being changed in accordance with given mounting positions of said heat generating electrical parts.

2. An electrical connection box having heat generating electrical parts contained therein, said electrical connection box including an upper case, a case body, and a lower case, wherein:

said case body has includes numerous attaching holes formed in a thickness direction of said case body;

at least one of said attaching holes receives a cooling device therein in such a manner that a heat absorbing side of the cooling device is positioned inside the electrical connection box and a heat radiating side of the cooling device is located outside of the electrical connection box; and a position of said cooling device is capable of being changed in accordance with given mounting positions of said heat generating electrical parts.

3. An electrical connection box having heat generating electrical parts contained therein, said electrical connection box including an upper case, a case body, and a lower case, wherein:

said case body has includes numerous attaching holes formed in a direction perpendicular to a thickness direction of said case body;

at least one of said attaching holes receives a cooling device therein in such a manner that a heat absorbing side of the cooling device is positioned inside the electrical connection box and a heat radiating side of the cooling device is located outside of the electrical connection box; and a position of said cooling device is capable of being changed in accordance with given mounting positions of said heat is generating electrical parts.

4. The electrical connection box according to claim 1, wherein said cooling device comprises a heat pipe.

5. The electrical connection box according to claim 2, wherein said cooling device comprises a heat pipe.

6. The electrical connection box according to claim 3, wherein said cooling device comprises a heat pipe.

* * * * *